United States Patent [19]

Astigiano et al.

[11] Patent Number: 4,657,452
[45] Date of Patent: Apr. 14, 1987

[54] CONTOURING MACHINE FOR PRINTED CIRCUITS

[75] Inventors: Florio Astigiano, Mondovi'; Ernesto Kaminski, Carcare, both of Italy

[73] Assignee: PRT-Pluritec Italia S.p.A., Burolo d'Ivrea, Italy

[21] Appl. No.: 698,609

[22] Filed: Feb. 6, 1985

[30] Foreign Application Priority Data

Feb. 9, 1984 [IT] Italy ............................. 67118 A/84

[51] Int. Cl.⁴ .............................................. B23C 9/00
[52] U.S. Cl. ............................. 409/190; 144/134 A; 409/205; 409/227
[58] Field of Search ............. 408/69, 70, 72 R, 87, 408/89, 94, 98, 100, 103, 109, 110, 114, 95; 409/180, 189, 190, 191, 197, 219, 903, 227, 235, 137; 144/134 A, 134 B, 134 R

[56] References Cited

U.S. PATENT DOCUMENTS

| 3,587,391 | 6/1971 | Pitts | 409/235 |
| 3,730,634 | 5/1973 | Gerber et al. | 408/88 X |
| 4,037,982 | 7/1977 | Clement | 409/137 X |
| 4,158,987 | 6/1979 | Smith | 144/134 A X |
| 4,212,570 | 7/1980 | Larsson | 408/95 |
| 4,244,669 | 1/1981 | Puritz et al. | 409/137 |
| 4,382,728 | 5/1983 | Anderson et al. | 408/88 X |
| 4,443,141 | 4/1984 | Kosmowski | 409/190 X |
| 4,530,627 | 7/1985 | Kosmowski | 144/134 A X |

FOREIGN PATENT DOCUMENTS 2841597 3/1980 Fed. Rep. of Germany ........ 408/95

Primary Examiner—Gil Weidenfeld
Assistant Examiner—Glenn L. Webb

[57] ABSTRACT

Contouring of a stack of one or more circuit boards is effected by first partially cutting the contour, leaving a portion of the contour long enough to ensure the rigidity of the circuit with respect to the board. The circuit is then clamped, while the remaining portion is cut without any discontinuity in the cutting. The machine comprises an operating head and a workpiece pressing pad which is operated for clamping the circuit during the cutting of the remaining portion of the contour. The pad is movable with respect to the head in a direction parallel to the uncut portion of the contour for displacement at least equal to the length of such portion. After the cut, as the head is raised, the pad is returned to rest position by the camming action of a roller against a sloping edge.

7 Claims, 3 Drawing Figures

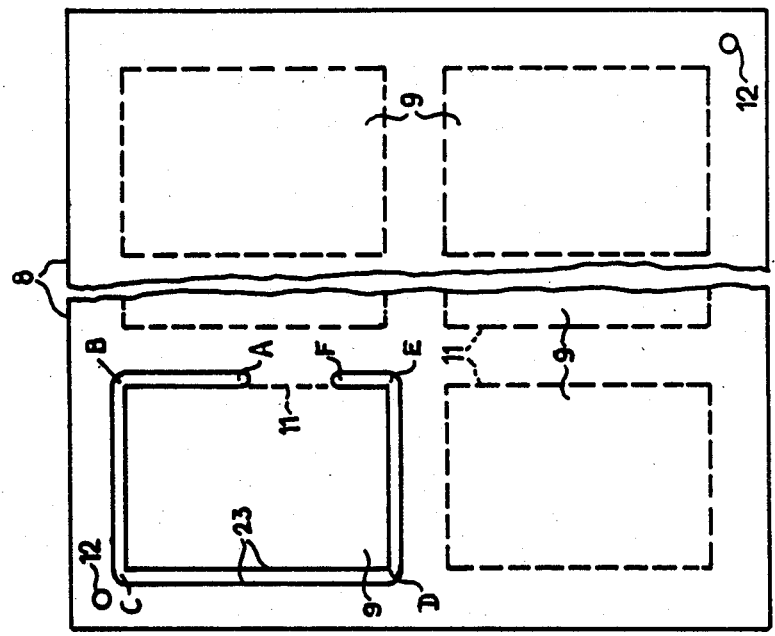
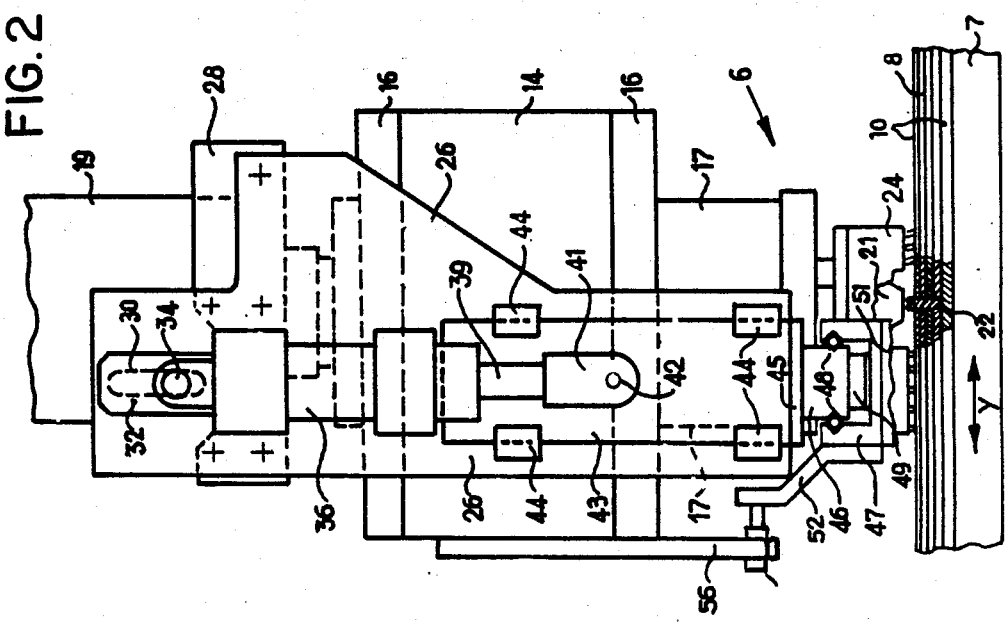

CONTOURING MACHINE FOR PRINTED CIRCUITS

BACKGROUND OF THE INVENTION

The present invention relates to a contouring method and machine for printed circuits, said machine comprising an operating head movable with respect to the board supporting the circuits for cutting the contour of the printed circuits, and a workpiece pressing device for pressing the circuit during the cutting.

Normally printed circuits are obtained by effecting various operations such as drilling, plating the metallic layer, photoetching etc. on a glass resin board supporting the circuit, said board being larger than the final printed circuit. If the size of the circuit is small, a plurality of mutually similar or dissimilar printed circuits can be obtained from a single board. After the above mentioned operations, the board must be cut along the planned contour by an operation called contouring, which must be very precise to avoid any discontinuity, step or irregularity in the contour.

To this end either one board, or a stack of boards, is at first secured to the machine table by means of reference members. Then the operating head is commanded by a numerical control to be moved so as to cut the contour of each circuit. In these machines the problem is always faced of cutting the last contour portion of the circuit, because when this portion becomes smaller than a limit dimension, it can no longer hold the circuit stationary, whereby an irregularity or step is formed in the contour.

To obviate this disadvantage, in some known machines, the individual circuits are normally provided with a pair of reference members, so that during the cutting of the last portion the printed circuit remains locked by said reference members. However, these machines cause the preparation of the package of boards to be very long and intricate, due to the multiplicity of dimensions of the circuits and the plurality of pairs of reference members necessary for the various circuits.

It has also been proposed to replace the pairs of reference members of the individual circuits with two contour portions of the circuit having a length of a few millimeters, which portions are left in a first cutting operation of the head. For this latter proposal there is provided a workpiece pressing device comprising a pad, which during the first cutting operation slides on the board. Then the head is positioned again on the two individual portions, which are thus used as reference members, while the pressure of the pad is increased so as to clamp the board, whereby the pad must also be displaced with respect to the tool during the cutting of the two portions. Therefore, the pad is mounted on the head so as to be displaced a few millimeters with respect to the tool and is returned elastically to rest when the pressure terminates.

These latter machines have the disadvantage of requiring three positioning operations for the head, which in any case generate some irregularities in the cutting of the contour. Furthermore, due to the small size of said portions, between the cutting of the first portion and the clamping of the circuit for the cutting of the second portion, the circuit can undergo some displacement unacceptable for the resulting contour. Finally, since the pad returns suddenly to rest when the pressure terminates, the circuits can be damaged thereby.

SUMMARY OF THE INVENTION

The technical problem of the invention resides in providing a contouring method and machine, wherein the head is positioned only once and which generates a contour of the circuit free of irregularities.

This technical problem is solved by the contouring machine according to the invention, which is characterized in that the workpiece pressing device is operable for clamping the circuit during the cutting of a portion of the contour long enough to ensure, before being cut, the rigidity of the circuit with respect to the boards, said device comprising at least one pad movable with respect to the head parallel to the board to allow a displacement thereof at least the length of said portion.

According to another characteristic of the invention the contour portion is rectilinear and the pad is carried by a slide which is slidable on a guide member parallel to said portion, said slide being returned to rest by the action of a cam and a cam follower effective while the slide is moving away from the cut printed circuit.

A preferred embodiment of the invention is now described by way of example, but not in a limiting sense, with the help of the accompanying drawings.

BRIEF DISCLOSURE OF THE DRAWINGS

FIG. 2 is a front view of the machine of FIG. 1 in a working position;

FIG. 3 is a diagramatic plan view of a board supporting a plurality of printed circuits to be cut.

DESCRIPTION OF PREFERRED EMBODIMENT

Figure 1:
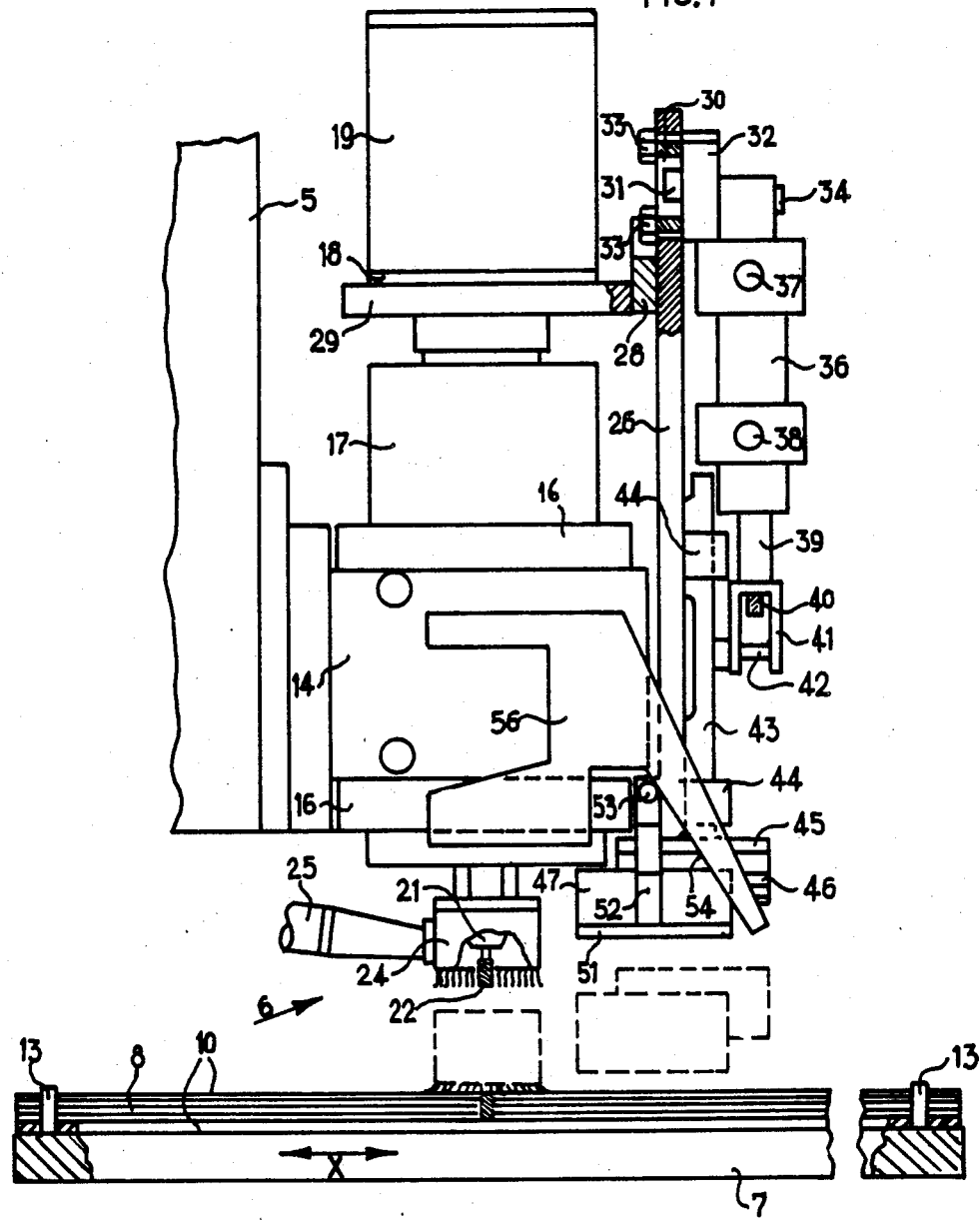
FIG. 1 is a side view of a portion of a contouring machine according to the invention.

With reference to FIG. 1, the numeral 5 indicates the stationary frame of a contouring machine comprising an operating head 6 for cutting the individual circuits and a workpiece supporting table 7. A package of a few boards 8 of glass resin is located on the table 7. In each of the boards 8 the conductors of a set of printed circuits 9 have been obtained by plating a metallic layer and by a subsequent photoetching. The boards 8 are packed between a pair of auxiliary protecting boards 10, known per se. The contour 11 of the individual printed circuits 9 is indicated by broken lines in FIG. 3.

The boards 8 and 10 are provided with two reference holes 12 (one at each corner) and are secured to the table 7 by engagement with the holes 12 of two reference pins 13 (FIG. 1) carried by the table 7. This latter is adapted to be displaced with respect to the head 6 along two orthogonal axes X and Y (FIGS. 1 and 2) parallel to the plane of the table 7. A numerical control apparatus, known per se, controls the head 6 to effect the cutting along the contour 11 programmed for the individual circuits 9.

The operating head 6 comprises a prismatic support structure 14 closed upwards and downwards by two metallic plates 16 secured to the frame 5. Located within the structure 14 is a double action pneumatic cylinder (not shown) operable for displacing a quill 17 vertically between a rest position shown in FIG. 1 and a working position shown in FIG. 2.

The quill 17 carries a plate 18 mounting an electric motor 19 for operating a tool carrying spindle 21. The spindle 21 is adapted to house a milling tool 22, having a diameter of a few millimeters, to effect a cutting 23 shown in FIG. 3 for one of the circuits 9. Located around the spindle 21 is a cup brush 24, which is adapted to effect a predetermined axial stroke on the quill 17 and is normally elastically held in the elongated position of FIG. 1. Inserted on the lateral surface of the cup brush 24 is a suction duct 25 for removing the chips produced by the cutting. In FIG. 1 the cup brush 24 is shown in broken lines in the contracted position assumed when the quill 17 is in its working position.

When the quill 17 is brought to the lower position of FIG. 2, the brush 24 leans against the package of boards 8 and 10, while the tool 22 goes on to cut the entire thickness of the board. Then the brush 24 on one hand exerts a predetermined elastic pressure on the board 8 to be cut, on the other hand it prevents the scattering of the produced chips and facilitates their suction. During the cutting, the brush 24 is moved along the contour 11 together with the spindle 21 and the tool 22. Obviously the pressure of the brush 24 is insufficient in absence of reference members or other clamping means for clamping the workpiece, in particular for clamping a nearly completely contoured circuit 9.

According to the invention, the contouring machine comprises a workpiece pressing device for pressing the circuit 9 during the cutting. Such a device comprises a vertical support bracket 26, which by means of screws (indicated by crosses in FIG. 2) is secured strongly to a vertical plate 28 welded on a horizontal bracket 29 secured to the plate 18. The bracket 26 is provided with a vertical notch 30 (FIG. 2), wherein a projection 31 (FIG. 1) of a block 32 is engaged. This latter is adjustably secured to the bracket 26 by means of two bolts 33 crossing the same notch 30. The block 32 carries a pivot 34, which is secured to the upper end of a double action pneumatic cylinder 36 selectively actuated through two valves 37 and 38. The cylinder 36 is adapted to operate a piston connected to a rod 39 extending downwards.

Adjustably secured to the lower end of the rod 39 by means of a bolt 40 is a fork 41, which carries a pin 42 connected to a vertical slide 43. This latter is guided by two pairs of L-shaped guides 44 secured to the bracket 26. The slide 44 carries downwards a horizontal plate 45 secured to a double guide 46. Mounted on this latter is a C-shaped slide 47 (FIG. 2) slidable, by means of two sets of balls 48, on the guide 46 along the X-axis.

Secured to the inner surface of the slide 47 is an end of a leaf spring 49, the other end of which is adapted to frictionally engage the lower surface of the guide 46 to prevent the free displacement of the slide 47 along the X-axis.

Secured to the lower surface of the slide 47 is a pad 51 made of a relatively elastic material having a high friction coefficient, for example rubber. The pad 51 is located substantially to the left of the tool 22 as seen in FIG. 2.

Finally, secured to the left side of the slide 47 is a profiled rod 52, carrying a cam follower, for example a roller 53. This latter is adapted to engage a cam element, having a tapered profile 54 carried by a plate 56 secured to the lower plate 16 of the stationary structure 14 of the operating head 6.

The contouring machine operates as follows:

After having positioned the package of boards 8, 10 on the reference pins 13, the numerical control apparatus is started for the contouring. At first the numerical control apparatus causes the table 7 to be rapidly displaced so as to bring a starting point A of the contour 11 (FIG. 2) of a circuit 9 to be cut onto the vertical axis of the tool 22. Said starting point A is located on one side of the contour 11 parallel to the X-axis. Then the quill 17 is lowered and causes the brush 24 to press the boards 8, 10, and the tool 22 to engage the upper board 10, while the pad 51 is brought into the position of FIG. 2. The tool 22, which is continuously rotated by the motor 19, at first bores the boards 8, 10 at the point A. Now the table 7 is displaced at a working speed, so as to cause the tool 22 to run the sides A, B, C, D, E, F of the contour 11 of the package of circuits 9. The point F is located on the same side of the contour 11 wherein the point A is located, at such a distance therefrom as to define a portion F-A of the contour 11 long enough to ensure the rigidity of each circuit 9 with respect to the relevant board 8, before such a portion is cut. By way of example this portion may be of the order of 3-5 cm.

The numerical control apparatus now commands the pneumatic cylinder 36 to push the piston downwards. Then the rod 39 of the piston furthermore lowers the slide 43 together with the guide 46 and the slide 47, thus causing the pad 51 to press forcibly the package of circuits 9. Thus these latter remain clamped and cannot be displaced, even if the portion of contour 11 still to be cut is very small.

Now the numerical control apparatus commands the further displacement of the table 7 along the X-axis, so as to complete the contouring of the package of circuits 9, without discontinuing the engagement of the tool 22 with the contour 11, and therefore without any discontinuity on the same. During this movement, the slide 47 is displaced to the right as seen in FIG. 1, together with the circuits 9 and the table 7, while the guide 46 remains in the same relative position with respect to the quill 7 and the tool 22.

At the end of the cutting of the portion F-A, the cylinder 36 is operated so as to bring the rod 39 upwards, together with the slide 43, the guide 46 and the slide 47, which remains in its displaced position along the X-axis with respect to the guide 46, due to the action of the spring 49. The pad 51 is thus removed from the circuit 9 without any dragging, and therefore without damaging the conductors of the circuit 9.

Finally, the quill 17 is displaced upwards, whereby the brush 24 and the tool 22 disengage the package of the contoured circuits 9 and the remaining boards 8, 10. In turn the bracket 26 is displaced upwards together with the cylinder 36, the slide 43, the guide 46 and the slide 47. In this movement, the roller 53 engages the tapered edge 54 of the plate 56, whereby the slide 47 is returned positively along the X-axis to the starting position with respect to the guide 46, thus overcoming the friction of the spring 49.

Therefore, it is evident that the contouring of the printed circuits 9 is effected by first partially cutting the contour of the circuit 9 so as to leave a portion F-A long enough to ensure, before cutting said portion, the rigidity of the circuit with respect to the board, then clamping the circuit 9 while said portion is cut without any discontinuity of cutting, and finally unclamping the cut circuit.

The pressure of the pad 51 on the package of circuits 9 can be adjusted by adjusting its initial position, i.e. by adjusting the block 32 along the notch 30 of the bracket 26, and by adjusting the length of the rod 39 by means of the screw 40.

It is intended that various modifications and improvements can be made to the contouring method and the relevant contouring machine, without departing from the scope of the invention. For example the clamping of the circuits and boards can be effected by using two or more separate pads 51 for the circuits and the boards. Furthermore, the pad 51 can be displaced in more than one direction. Finally, the pad 51 can be returned to rest by means different from the cam 54, such as by a member operated by a suitably commanded electromagnet.

We claim:

1. A contouring machine for printed circuits having a workpiece supporting table for supporting the printed circuit boards to be cut, an operating head displaceable in a direction perpendicular to said table between a rest position and an operative position, means for relatively moving said table and said head in a direction parallel to said board to enable said head when in said operative position to cut the contour of the printed circuit, a workpiece clamping member mounted on said operating head operable for clamping the circuit during the cutting of a portion of the contour long enough to ensure the rigidity of the circuit with respect to the board before cutting said portion, said clamping member being mounted for limited movement from a starting position parallel to said board to allow a displacement of the operating head with respect to said board, wherein said machine includes a guide member for slidably guiding said clamping member in said limited movement, a support secured to said head for mounting said guide member for displacement in said perpendicular direction, displacing means for additionally displacing said guide member and said clamping member with respect to said support in said perpendicular direction to enable said clamping member to clamp the printed circuit to be cut, whereby said clamping member is moved parallel to said board when said head cuts said portion while said printed circuit is so clamped, friction means for frictionally connecting said clamping member and said guide member to prevent a dragging of said clamping member on said circuit at the instant said displacing means causes said clamping member to disengage the circuit so cut, and means effective after said clamping member has disengaged from the so cut circuit for positively engaging said clamping member as to overcome said friction means and for returning said clamping member to said starting position on said guide means.

2. A machine according to claim 1, characterized in that said portion is rectilinear and said clamping member includes a pad carried by a slide slidably guided by said guide member in a rectilinear direction parallel to said portion, said pad having a rectangular shape with a pair of sides parallel to said portion.

3. A machine according to claim 2 characterized in that said slide is slidable on said guide member by means of a set of revolving elements, said friction means including a leaf spring carried by said slide and so dimensioned as to frictionally engage said guide member to prevent dragging of said pad on the circuit at the instant of the disengagement of said pad from the circuit.

4. A machine according to claim 1, characterized in that said effective means include a cam element and a cam following element, one of said elements being secured to said head the other element being secured to the pad, said elements being rendered effective by the lifting away movement of said slide and of said guide member from the cut printed circuit.

5. A contouring machine for printed circuits having a workpiece table for supporting printed circuit boards, an operating head displaceable in a direction perpendicular to said table and means for relatively moving said table and said head according to the contours of the printed circuit to be cut, said head including a rotatable cutting tool for cutting the contour of the printed circuit and a housing having substantially circular section and mounted concentrically with said cutting tool, said housing being adapted to engage said board during the cutting operation for providing a closed chamber around said cutting tool, a duct connected to said housing for evacuating the cuttings produced by said cutting tool and a workpiece pressing device operable for pressing the said board on said table, wherein said pressing device comprises a support secured to said head, a guide member mounted on said support for an additional displacement in a direction perpendicular to said table, at least one pad guided by said guide member in a direction parallel to said board to allow a movement of said pad with respect to said head at least as long as a portion of said contour long enough to ensure the rigidity of the circuit with respect to the board before cutting said portion, and means for causing said additional displacement of the guide member to cause said pad to clamp said circuit during the cutting to said portion, said pad, said guide member and said support being located outside said cylindrical housing and being in respect to said cylindrical housing separate and distinctly displaceable in said perpendicular direction, whereby the evacuating operation of said housing is not altered during the cutting of said portion.

6. A machine according to claim 5, wherein said portion is rectilinear and said pad is carried by a slide slidable with respect to said guide member parallel to said portion, and wherein said means for causing said additional displacement of said slide and said guide member perpendicularly to the board include a double action fluid actuated cylinder mounted on said support.

7. A machine according to claim 5, characterized by means for adjusting the pressure of the pad on the circuit, comprising means for securing the said support in an adjustable position on the head.

* * * * *